(12) United States Patent
Blumenschein et al.

(10) Patent No.: US 11,864,321 B2
(45) Date of Patent: Jan. 2, 2024

(54) ELECTRICAL ELEMENT, METHOD OF PREPARING AN ELECTRICAL ELEMENT FOR A SOLDERING STEP, AND DEVICE FOR PREPARING AN ELECTRICAL ELEMENT FOR A SOLDERING STEP

(71) Applicant: TE Connectivity Germany GmbH, Bensheim (DE)

(72) Inventors: Rudi Blumenschein, Woert (DE); Andre Martin Dressel, Bensheim (DE); Florian Brabetz, Bensheim (DE); David Greth, Woert (DE)

(73) Assignee: TE Connectivity Germany GmbH, Bensheim (DE)

( * ) Notice: Subject to any disclaimer, the term of this patent is extended or adjusted under 35 U.S.C. 154(b) by 6 days.

(21) Appl. No.: 17/554,598

(22) Filed: Dec. 17, 2021

(65) Prior Publication Data

US 2022/0201866 A1    Jun. 23, 2022

(30) Foreign Application Priority Data

Dec. 18, 2020 (DE) .......................... 102020134205.5

(51) Int. Cl.
*H05K 1/18* (2006.01)
*H05K 3/00* (2006.01)
*H01B 7/08* (2006.01)
*H05K 3/34* (2006.01)

(52) U.S. Cl.
CPC ........... *H05K 1/183* (2013.01); *H05K 3/0014* (2013.01); *H01B 7/08* (2013.01); *H05K 3/34* (2013.01); *H05K 2201/09036* (2013.01); *H05K 2203/0195* (2013.01)

(58) Field of Classification Search
CPC ....... H05K 1/183; H05K 1/021; H05K 1/0284
See application file for complete search history.

(56) References Cited

U.S. PATENT DOCUMENTS

| 3,547,718 | A  | 12/1970 | Gordon |
| 5,994,648 | A  | 11/1999 | Glovatsky et al. |
| 7,223,635 | B1 | 5/2007  | Brewer |
| 10,249,564 | B2 | 4/2019 | Murakami et al. |
| 2003/0231474 | A1 | 12/2003 | Boggs et al. |
| 2006/0010674 | A1 | 1/2006 | Maussner et al. |
| 2009/0212416 | A1 | 8/2009 | Skeete |

(Continued)

FOREIGN PATENT DOCUMENTS

| DE | 1765434 A1   | 7/1971 |
| DE | 8600878.1 U1 | 4/1986 |

(Continued)

OTHER PUBLICATIONS

German Office Action, App No. 10 2020 134 205.5, dated Sep. 13, 2021, 6 pages.

(Continued)

*Primary Examiner* — Jeremy C Norris
(74) *Attorney, Agent, or Firm* — Barley Snyder

(57) ABSTRACT

An electrical element includes a pair of conducting elements spaced from one another, a recess receiving an electrical component, and a trough extending from a first conducting element of the pair of conducting elements to a second conducting element of the pair of conducting elements. The conducting elements are at least partially exposed in the recess.

19 Claims, 3 Drawing Sheets

(56) References Cited

U.S. PATENT DOCUMENTS

| | | | |
|---|---|---|---|
| 2013/0213697 A1* | 8/2013 | Palaniswamy | H01L 33/486 |
| | | | 174/254 |
| 2013/0215584 A1 | 8/2013 | Klein et al. | |
| 2014/0177177 A1 | 6/2014 | Huang et al. | |
| 2018/0061751 A1 | 3/2018 | Murakami et al. | |

FOREIGN PATENT DOCUMENTS

| | | |
|---|---|---|
| DE | 69709176 T2 | 7/2002 |
| DE | 102006021560 A1 | 11/2007 |
| DE | 102010050342 A1 | 5/2012 |
| DE | 102013203666 A1 | 9/2014 |
| FR | 2961057 A1 | 12/2011 |
| JP | H4071288 A | 3/1992 |
| JP | 2018032773 A | 3/2018 |
| JP | 2019121626 A | 7/2019 |
| WO | 2005088736 A1 | 9/2005 |
| WO | 2011151558 A1 | 12/2011 |
| WO | 201921692 A1 | 11/2019 |

OTHER PUBLICATIONS

Extended European Search Report, Application No. 21216087.3-1211, dated May 6, 2022, 46 pages.
Office Action from the Japanese Patent Office dated Jan. 4, 2023, corresponding to Application No. 2021-202987 with English translation, 9 pages.
Japanese Office Action dated Jul. 11, 2023 with English translation, corresponding to Application No. 2021-202987, 10 pages.

* cited by examiner

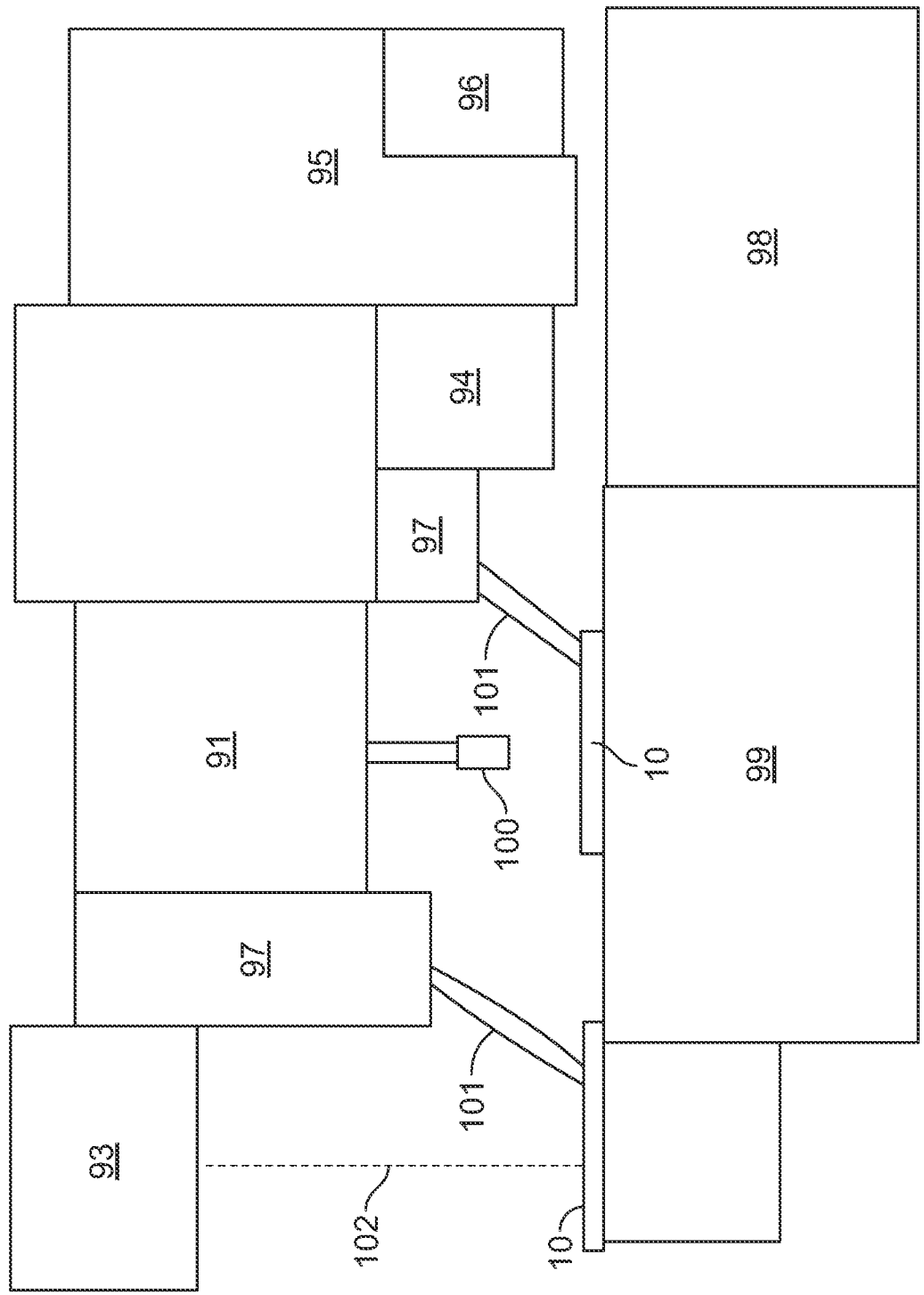

ELECTRICAL ELEMENT, METHOD OF PREPARING AN ELECTRICAL ELEMENT FOR A SOLDERING STEP, AND DEVICE FOR PREPARING AN ELECTRICAL ELEMENT FOR A SOLDERING STEP

CROSS-REFERENCE TO RELATED APPLICATIONS

This application claims the benefit of the filing date under 35 U.S.C. § 119(a)-(d) of German Patent Application No. 102020134205.5, filed on Dec. 18, 2020.

FIELD OF THE INVENTION

The present invention relates to an electrical element with two conducting elements that are spaced from each other and that are exposed partially by forming a recess for receiving an electrical component.

BACKGROUND

An electrical element can be, for example, a ribbon cable as used for monitoring battery cells in electrically powered vehicles. In this context, a temperature-sensitive electrical component is often arranged between two conducting elements of the electrical element in order to monitor the temperature. Typically, the component is inserted into the receptacle and soldered.

A disadvantage in the prior art is that the electrical component sometimes moves in further production steps, resulting in either a defective soldering or correct soldering that is classified as defective by a downstream control system.

SUMMARY

An electrical element includes a pair of conducting elements spaced from one another, a recess receiving an electrical component, and a trough extending from a first conducting element of the pair of conducting elements to a second conducting element of the pair of conducting elements. The conducting elements are at least partially exposed in the recess.

BRIEF DESCRIPTION OF THE DRAWINGS

The invention will now be described by way of example with reference to the accompanying Figures, of which:

FIG. 3 is a schematic side view of device according to an embodiment for preparing an electrical element.

DETAILED DESCRIPTION OF THE EMBODIMENT(S)

Figure 1:
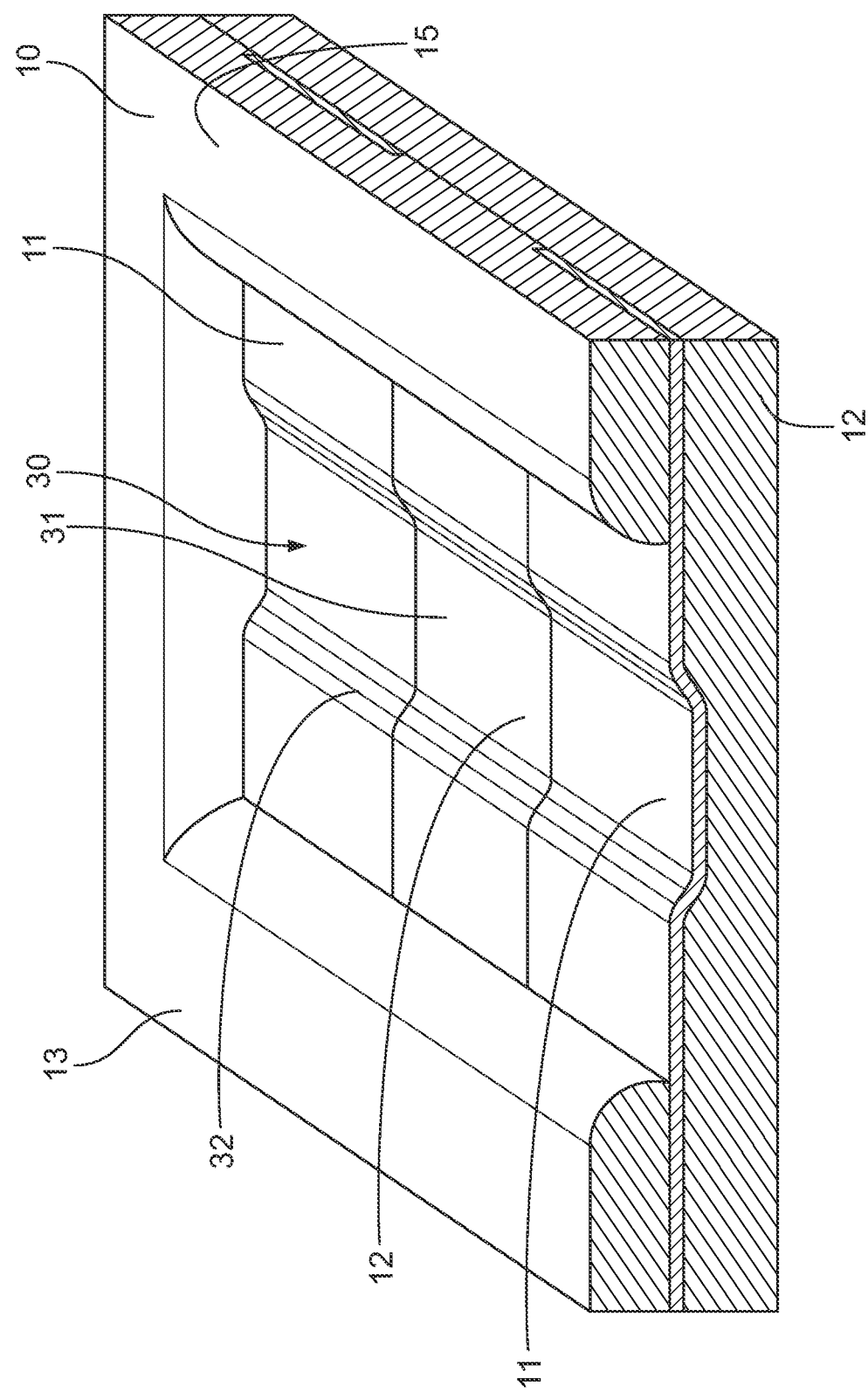
FIG. 1 is a schematic sectional perspective view of an electrical element according to an embodiment.

In the following, the invention is explained in more detail with reference to embodiments shown in the drawings. The developments and configurations shown are independent of each other and can be arbitrarily combined with each other, depending on necessity in the application.

Figure 2:
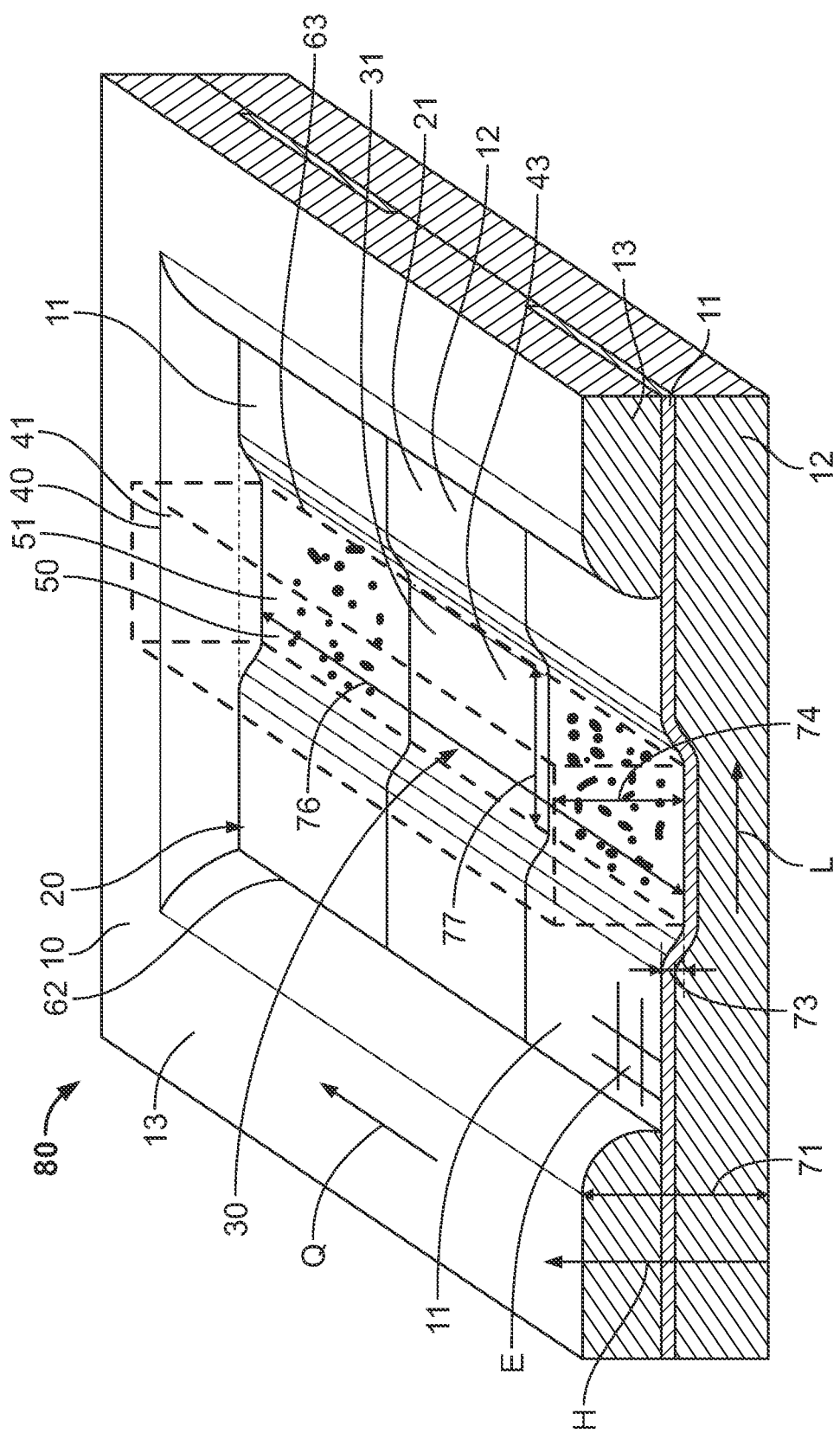
FIG. 2 is a schematic sectional perspective view of the electrical element of FIG. 1 with an inserted electrical component.

As shown in FIGS. 1 and 2, an electrical element 10 according to an embodiment is shown in which two conducting elements 11 that are spaced from each other are partially exposed by forming a recess 20 for receiving an electrical component 40. The electrical element 10 may be, for example, a ribbon cable 15 that is used to measure voltages in interconnected battery cells, such as those used in electric automobiles.

As shown in FIG. 2, an additional electrical component 40, such as a temperature-sensitive NTC (negative temperature coefficient) 41, can be arranged between two conducting elements 11 to monitor the temperature. Often, this component 40 is attached to the conducting elements 11 by soldering, for example HF soldering (high frequency soldering). In previous methods, the electrical component 40 is inserted into the recess 20 in the desired position and orientation. However, during further processing, particularly during a soldering step, the position and orientation of the electrical component 40 may change undesirably. This can result in a defective component.

In order to prevent such a change in position and/or orientation of the electrical component 40, the embodiment of an electrical element 10 shown in FIGS. 1 and 2 comprises a trough 30 in the recess 20 that aligns the electrical component 40 and helps to maintain the alignment. The trough 30 extends from one conducting element 11 to the other conducting element 11. In the embodiment shown, the trough 30 extends to the conducting elements 11 and the conducting elements 11 are part of the side walls 32 and base 31 of the trough 30.

In an embodiment, the trough 30 is formed in by plastic deformation. For example, a tool in the form of a punch can be pressed against a height direction H into a base 21 of the recess 20. The tool can thereby permanently plastically deform the conducting elements 11 and a carrier 12 of the electrical element 10. The deformation may in particular be a cold deformation, for example a pressure deformation, indentation, or sinking. Melting or heating is not necessary, however, it may have a positive effect on the result under certain circumstances. In a configuration alternative to cold forming, plastic deformation can take place at least partially in a warm state, i.e. at elevated temperatures, in particular at temperatures higher than the intended service temperature of the element and/or higher than a room temperature. Plastic deformation at such temperatures may be easier to carry out. In addition, plastic deformation at elevated temperatures can avoid stresses in the element. In an alternative configuration, not shown, the forming of the trough 30 could also be carried out by removing material, for example, by etching, cutting, or grinding.

The conducting elements 11 are arranged between the carrier 12 and a layer 13 lying above it and embedded in the electrical element 10, as shown in FIGS. 1 and 2. The conducting elements 11 are elongated, band-shaped, strip-shaped or ribbon-shaped and run parallel to one another along a longitudinal direction L of the electrical element 10. The embedding of the conducting elements 11 protects the conducting elements 11. The layer 13 is materially bonded to the carrier 12. The carrier 12 and the layer 13 are made of an electrically non-conducting material. A possible material for the carrier 12 and/or the layer 13 is PVC or another plastic.

In the embodiment shown in FIG. 2, the trough 30 occupies only part of the area of the recess 20, since in this case, the recess 20 cannot or does not have to assume a holding function for the electrical element 10. A cross-sectional area 62 of the recess 20 is substantially larger than a cross-sectional area 63 of the trough. For example, the recess 20 can have a cross-sectional area 62 at least 50% larger than the trough 30, and a maximum of 500% larger. The cross-sectional areas 62, 63 are each measured parallel to a plane E of the electrical element 10, in particular its surface. The plane E of the electrical element 10 is perpendicular to the height direction H and runs parallel to the longitudinal direction L and parallel to a transverse direction Q along which the conducting elements 11 are spaced from one another. The electrical element 10 can have several conducting elements 11 running parallel to each other, between which the trough 30 is located. Thus, different pairs of conducting elements 11 can be connected by respective different troughs 30.

In the example shown in FIG. 2, the trough 30 is approximately the same width as the recess 20 in the transverse direction Q. Along the longitudinal direction L, however, the trough 30 is only approximately one third as long as the recess 20. The recess 20 can therefore not achieve a holding function for the electrical component 40 along the longitudinal direction L. However, for process-related reasons, it may be necessary for the recess 20 to be considerably longer along the longitudinal direction L than the component 40 to be received, for example in order to be able to clean the recess 20 easily or in order not to damage the layer 13 during a soldering process.

The electrical element 10 is strip-shaped or plate-shaped. In the height direction H, its extension is substantially smaller, for example by a maximum of 10 percent, than its extension in the transverse direction Q. Along the longitudinal direction L, the electrical element 10 can again be substantially larger than along the transverse direction Q, for example by a factor of 5 to 10.

In addition to the flat ribbon cable 15 shown, a flexible or rigid printed circuit board (FPC) can be used as an electrical element 10.

The trough 30 is V-shaped or funnel-shaped in the embodiment shown in FIGS. 1 and 2. The trough 30 narrows against the height direction H, thus, away from the recess 20. This allows automatic positioning and adjustment of the electrical component 40. Furthermore, such a configuration can be easy to manufacture. The side walls 32 run at a slight angle to the height direction H, in an embodiment between 80° and 20°, and merge into the flat, continuous base 31. In this context, the base 31 is parallel to the plane E. The trough 30 is configured like a blind hole, thus, it is continuously closed in the area of the side walls 32 and the base 31 and only open on one side along the height direction H. The trough 30 is recessed from the rest of the surface of the element 10.

As shown in FIG. 2, the trough 30 has a depth 73 that is approximately 20 percent of the height 71 of the element 10 and 20 percent of the height 74 of the component 40. In various embodiments, to improve the holding effect, the depth 73 can be at least 5%, 10%, 20%, or 50% of the height 74. Depending on the application, a value of 20%, 30%, 50%, 80%, or 90% can be considered as the maximum value. This allows good adjustment and support without at the same time interfering too much with the carrier 12. In an embodiment, the trough 30 may have a depth corresponding to at least 5%, 10%, more 20%, or 50% of the height 71 of the electrical element 10. Again, a value of 20%, 30%, 50%, 80%, or 90% can be considered as a maximum value. The higher the value, the more securely the electrical component 40 is held. However, with higher values, the electrical element 10 becomes mechanically weaker.

A width 76 of the trough 30 measured along the transverse direction Q is substantially greater than its depth 73, for example by a factor of 20. A length 77 of the trough 30 measured along the longitudinal direction L is greater than its depth 73, for example by a factor of 10. A ratio of depth to width 76 and/or length 77 of the trough 30 may be at least 1:20. In other embodiments, it may be at least 1:10, 1:3, or 1:2. A ratio of 1:5, 1:3, or 1:2 may be considered as a maximum value. The flatter the trough 30, the easier it is to form. However, with deeper troughs 30, the holding effect is higher.

The recess 20 may be created, for example, by laser ablation of the layer 13. In alternative configurations, the recess 20 may be created, for example, by cutting out or melting the layer 13.

FIG. 2 shows an arrangement 80 comprising the electrical element 10 and the electrical component 40 arranged therein. In order to achieve the best possible holding effect, a lower side 43 of the electrical component 40 is approximately complementary to the base 31 of the trough 30. This can be achieved, for example, by using a tool for forming the trough 30, the lower side of which is similar to the lower side 43 of the electrical component 40 to be inserted.

The formed trough 30 positions and holds the electrical component 40 during further production steps, in particular during a soldering step. This prevents the component 40 from slipping in subsequent method steps so that it can always be fixed in the correct position, for example soldered, glued, crimped or welded. This makes it possible to reduce the number of defective products. In the shown embodiment, the conducting elements 11 are parts of the trough 30, which makes it possible to hold the electrical component 40 in the recess 20 in a position in which it contacts the conducting elements 11. The trough 30 can extend onto the conducting elements 11 and/or extend over the conducting elements 11. This also allows easy contacting of the conducting elements 11 by the electrical component 40.

As shown in FIG. 2, the electrical component 40 can be electrically conductively connected to a conducting element 11 at one end in each case so that it electrically connects the two conducting elements 11. For this purpose, solder 50 may be present between the electrical component 40 and the conducting element 11 in each case. The solder 50 can be applied, for example, in the form of a paste 51 after the trough 30 has been formed in the area of the conducting elements 11. The electrical component 40 can then be inserted. By soldering, for example HF soldering, the electrical component 40 can then be joined to the respective conducting element 11.

The method according to the invention can be carried out with a device 90 according to the invention. A possible configuration of such a device 90 is shown schematically in FIG. 3.

The device 90 comprises a trough forming device 91 shown in FIG. 3 configured to form the trough 30 for the electrical component 40 into the electrical element 10. The trough forming device 91 is configured as a forming mechanism 92, which at least partially plastically forms the element 10. For this purpose, it has a tool in the form of a punch 100 or a die which can be moved towards and into the element 10. In order to have a stable counter-support during forming, the electrical element 10 is supported on a table 99 during this step.

In order to move the electrical element 10 onto and away from the table 99, a gripping device 97 with pivotable gripping arms 101 are provided.

Prior to forming the trough 30, a laser ablation mechanism 93 is used to create the indentation 20 in the element 10 by removing the layer 13 with a laser beam 102, as shown in FIG. 3.

After the trough 30 has been formed and repositioned by the gripping device 97, solder 50 in the form of a paste 51 is introduced into the trough 30 by a solder application mechanism 94.

The element 10 is then transported by a feed mechanism 98, which may comprise a conveyor belt, to an insertion mechanism 95. The component 40 is inserted there.

Finally, a soldering mechanism 96 is used to solder the component 40 to the conducting elements 11, for example by HF soldering.

What is claimed is:

1. An electrical element, comprising:
   a pair of conducting elements spaced from one another;
   a recess receiving an electrical component, the conducting elements are at least partially exposed in the recess; and
   a trough extending from a first conducting element of the pair of conducting elements to a second conducting element of the pair of conducting elements, the conducting elements extend across the trough.

2. The electrical element of claim 1, wherein the trough is formed by plastic deformation.

3. The electrical element of claim 1, further comprising a carrier and a layer, the conducting elements are arranged between the carrier and the layer.

4. The electrical element of claim 1, wherein the trough is only disposed in a portion of the recess.

5. The electrical element of claim 1, wherein the electrical element is strip-shaped or plate-shaped.

6. The electrical element of claim 1, wherein the electrical element is a ribbon cable or a part of a ribbon cable.

7. An arrangement, comprising:
   an electrical element including a pair of conducting elements spaced from one another, a recess, and a trough extending from a first conducting element of the pair of conducting elements to a second conducting element of the pair of conducting elements, the conducting elements are at least partially exposed in the recess, the electrical element is a ribbon cable or a part of a ribbon cable; and
   an electrical component attached in the trough and electrically connected to the conducting elements.

8. The arrangement of claim 7, wherein a shape of the trough is complementary to a lower side of the electrical component.

9. A method for preparing an electrical element, comprising:
   providing the electrical element including a pair of conducting elements spaced from one another and a recess, the conducting elements are at least partially exposed in the recess; and
   forming a trough in the recess, the trough extending from a first conducting element of the pair of conducting elements to a second conducting element of the pair of conducting elements, the trough is formed in the recess by plastic deformation.

10. The method of claim 9, further comprising positioning an electrical component in the trough, the electrical component is electrically connected to the conducting elements.

11. The method of claim 10, wherein the forming step is performed with a tool that corresponds at least partially to a shape of the electrical component.

12. The method of claim 10, further comprising soldering the electrical component in the trough.

13. The method of claim 9, wherein the conducting elements are deformed during the forming step.

14. The method of claim 9, wherein the conducting elements are disposed between a carrier and a layer of the electrical element.

15. The method of claim 14, further comprising partially removing the layer prior to forming the trough.

16. A device for preparing an electrical element, comprising:
   a trough forming device forming a trough for an electrical component in the electrical element, the electrical element including a pair of conducting elements spaced from one another and a recess, the conducting elements are at least partially exposed in the recess and the trough is formed in the recess by plastic deformation.

17. A method for preparing an electrical element, comprising:
   providing the electrical element including a pair of conducting elements spaced from one another and a recess, the conducting elements are at least partially exposed in the recess; and
   forming a trough in the recess, the trough extending from a first conducting element of the pair of conducting elements to a second conducting element of the pair of conducting elements, the conducting elements are deformed during the forming step.

18. A method for preparing an electrical element, comprising:
   providing the electrical element including a pair of conducting elements spaced from one another and a recess, the conducting elements are at least partially exposed in the recess; and forming a trough in the recess, the trough extending from a first conducting element of the pair of conducting elements to a second conducting element of the pair of conducting elements, the conducting elements are disposed between a carrier and a layer of the electrical element.

19. The method of claim 18, further comprising partially removing the layer prior to forming the trough.

* * * * *